United States Patent
Tsai et al.

(10) Patent No.: US 8,901,007 B2
(45) Date of Patent: Dec. 2, 2014

(54) ADDITION OF CARBOXYL GROUPS PLASMA DURING ETCHING FOR INTERCONNECT RELIABILITY ENHANCEMENT

(71) Applicant: Taiwan Semiconductor Manufacturing Co., Ltd., Hsin-Chu (TW)

(72) Inventors: Cheng-Hsiung Tsai, Chunan Town (TW); Chung-Ju Lee, Hsinchu (TW); Sunil Kumar Singh, Hsinchu (TW); Tien-I Bao, Dayuan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 3 days.

(21) Appl. No.: 13/733,222

(22) Filed: Jan. 3, 2013

(65) Prior Publication Data

US 2014/0187044 A1    Jul. 3, 2014

(51) Int. Cl.
*H01L 21/3065* (2006.01)
*H01L 21/311* (2006.01)

(52) U.S. Cl.
CPC .......... *H01L 21/3065* (2013.01); *H01L 21/311* (2013.01)
USPC ........... 438/710; 438/717; 438/723; 438/734; 216/17; 216/41; 216/67

(58) Field of Classification Search
USPC ......... 438/710, 717, 723, 734; 216/17, 41, 67
See application file for complete search history.

(56) References Cited

U.S. PATENT DOCUMENTS

| | | | |
|---|---|---|---|
| 6,635,185 B2 * | 10/2003 | Demmin et al. | 216/64 |
| 2004/0137748 A1 * | 7/2004 | Jain et al. | 438/710 |
| 2005/0023694 A1 * | 2/2005 | Bjorkman et al. | 257/758 |
| 2005/0101135 A1 * | 5/2005 | Annapragada et al. | 438/689 |
| 2005/0266691 A1 * | 12/2005 | Gu et al. | 438/706 |
| 2007/0287292 A1 * | 12/2007 | Li et al. | 438/694 |
| 2008/0076260 A1 * | 3/2008 | Muramatsu et al. | 438/736 |
| 2008/0146036 A1 * | 6/2008 | Lai et al. | 438/710 |
| 2009/0156012 A1 * | 6/2009 | Hsieh et al. | 438/719 |
| 2010/0043821 A1 * | 2/2010 | Li et al. | 134/1.2 |

* cited by examiner

*Primary Examiner* — Shamim Ahmed
(74) *Attorney, Agent, or Firm* — Eschweiler & Associates, LLC

(57) ABSTRACT

The present disclosure is directed to a method of manufacturing a semiconductor structure in which a low-k dielectric layer is formed over a semiconductor substrate. Features can be formed proximate to the low-k dielectric layer by plasma etching with a plasma formed of a mixture of a $CO_2$, CO, or carboxyl-containing source gas and a fluorine-containing source gas. The method allows for formation of damascene structures without encountering the problems associated with damage to a low-K dielectric layer.

20 Claims, 4 Drawing Sheets

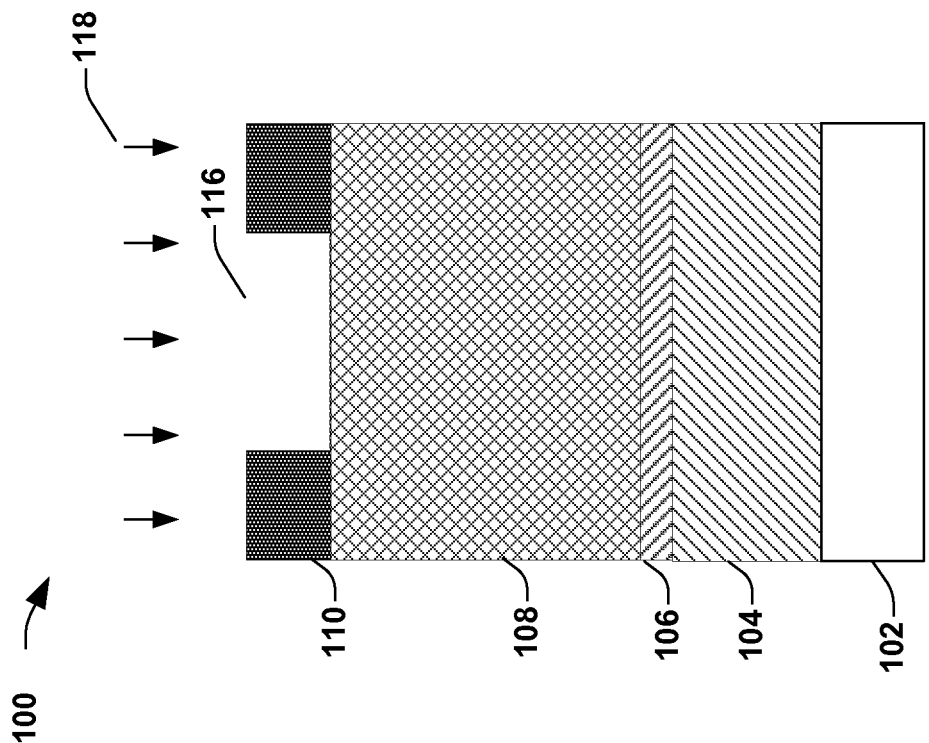
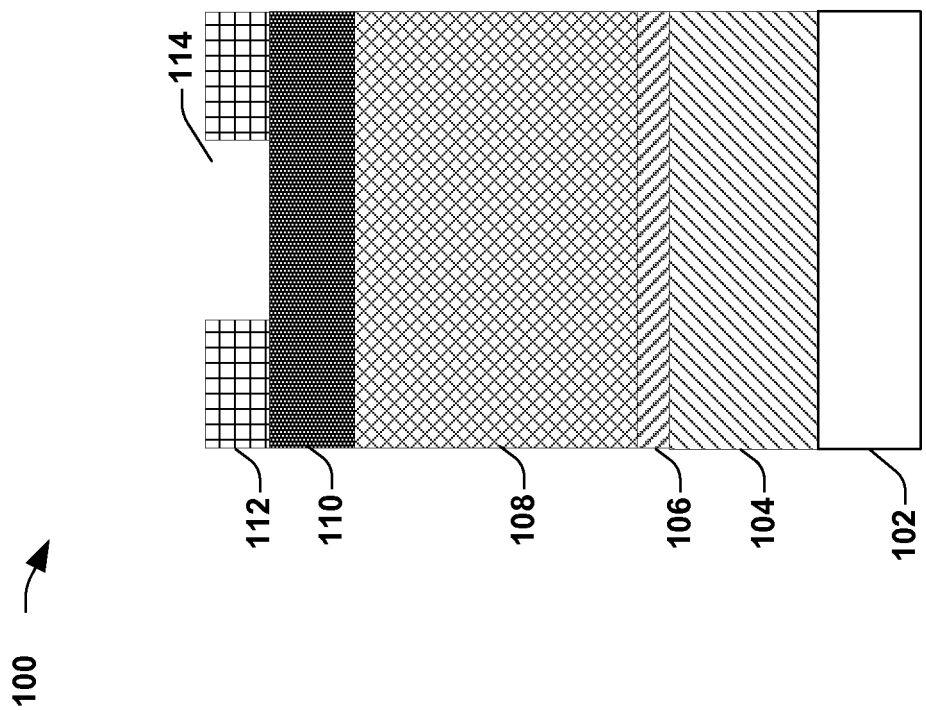

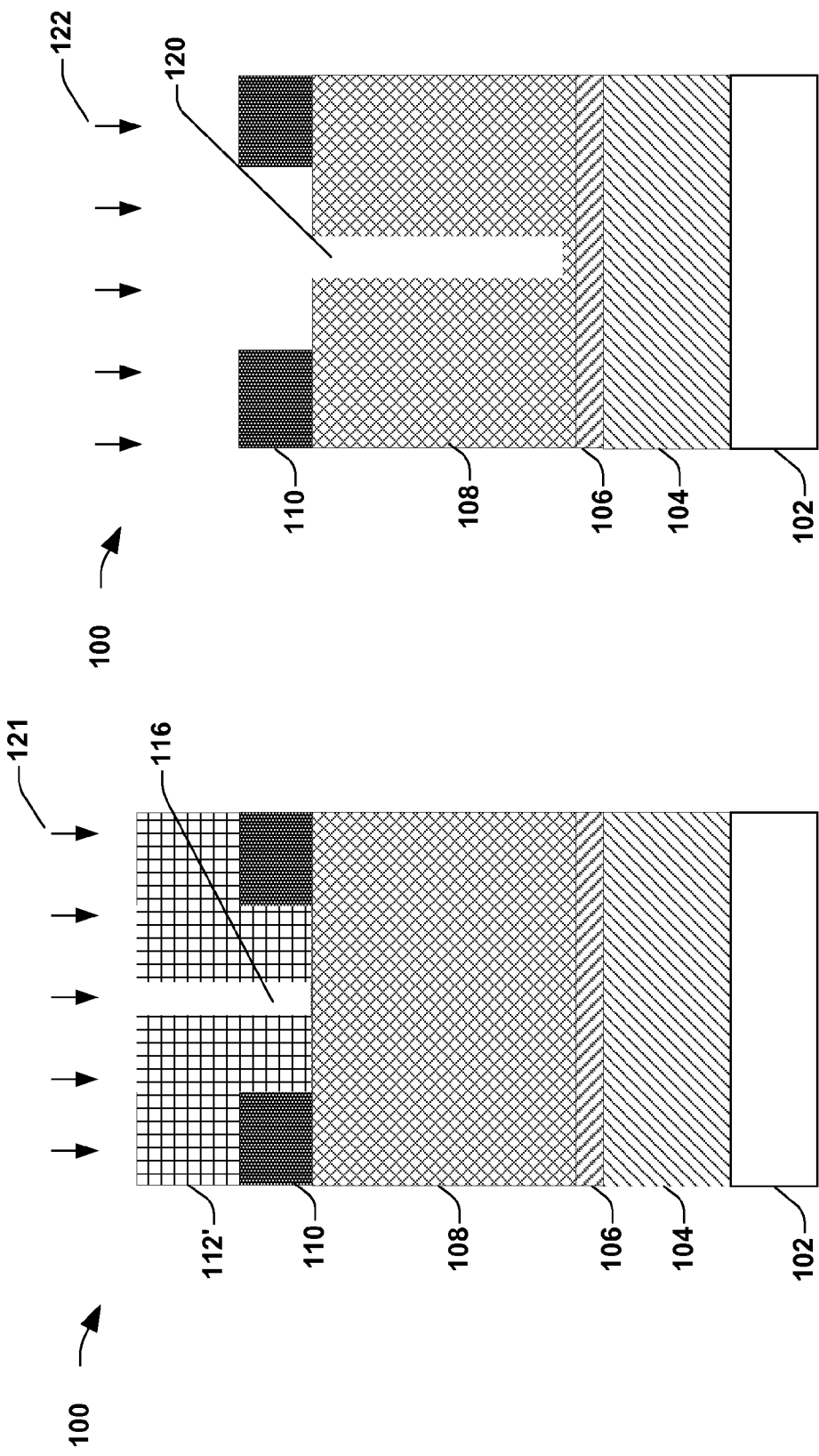

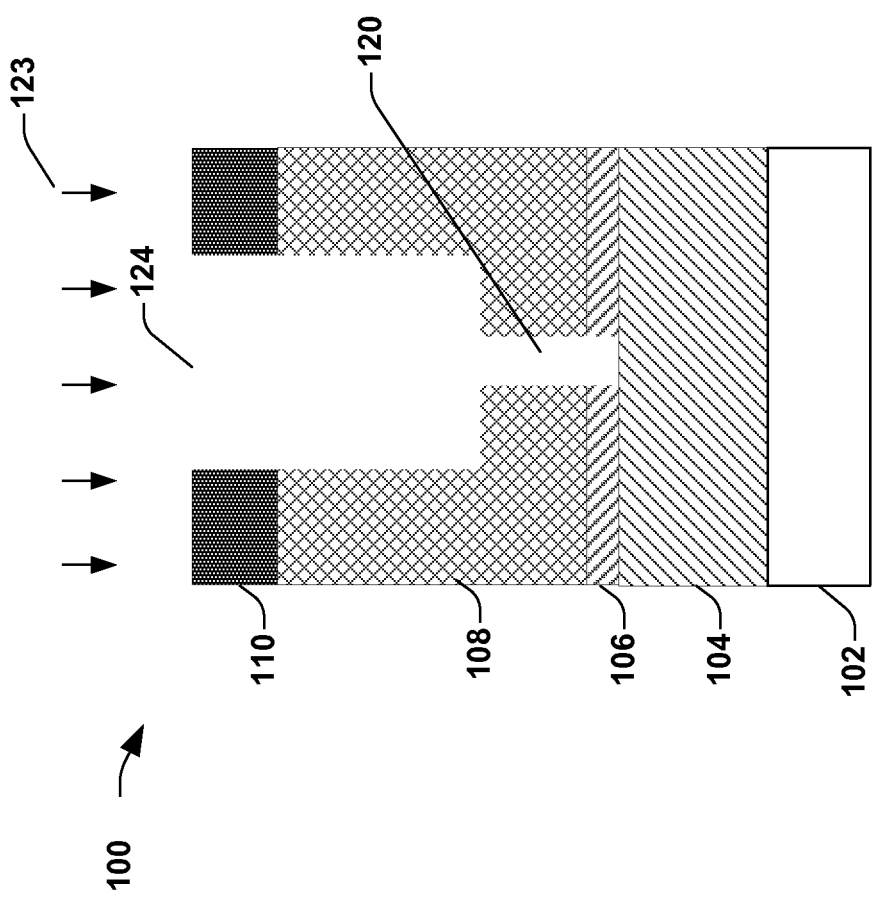

ADDITION OF CARBOXYL GROUPS PLASMA DURING ETCHING FOR INTERCONNECT RELIABILITY ENHANCEMENT

BACKGROUND

As the density of semiconductor devices increases and the size of circuit elements becomes smaller, the resistance capacitance (RC) delay time increasingly dominates the circuit performance. To reduce the RC delay, there is a desire to switch from conventional dielectrics to low-k dielectrics. These materials are particularly useful as intermetal dielectrics, IMDs, and as interlayer dielectrics, ILDs. However, low-k materials present problems during processing, especially during the processing of the conductive material used to make interconnects.

BRIEF DESCRIPTION OF THE DRAWINGS

FIGS. 1A-1E are partial cross sectional views illustrating steps of forming an embodiment of an integrated circuit in accordance with the disclosure.

DETAILED DESCRIPTION

Figure 2:
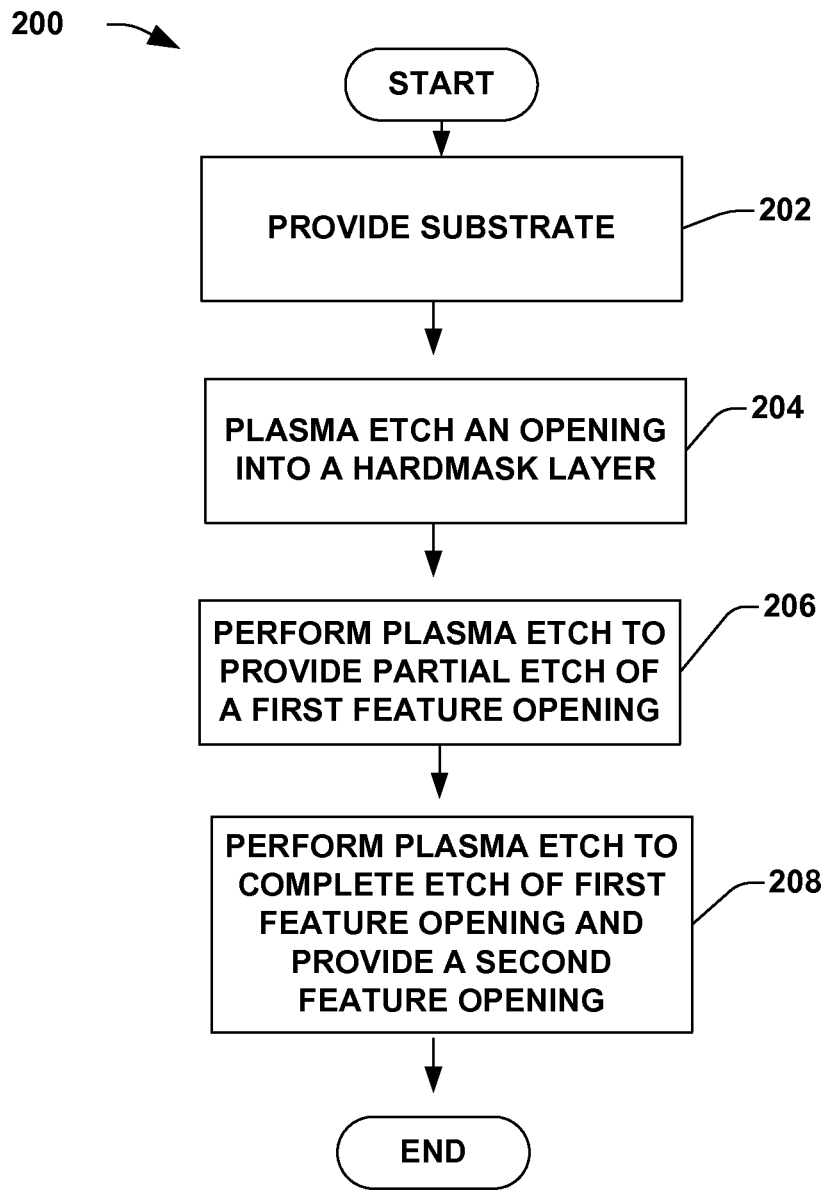
FIG. 2 illustrates a flow diagram of some embodiments of a method for the fabrication of a semiconductor structure in accordance with the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

In forming damascene structures in integrated circuit manufacturing processes, the surface condition of the damascene opening is critical for achieving acceptable adhesion and coverage of overlying layers. For example, a dual damascene opening is formed in an inter-metal dielectric (IMD) insulating layer in a series of photolithographic patterning and etching processes, followed by formation of a barrier layer and a metal filling process.

Increasingly, low-K layers are required to reduce signal delay and power loss effects as integrated circuit devices are scaled down. One way this has been accomplished has been to introduce porosity or dopants into the dielectric insulating layer.

As a result, the need for lower dielectric constant materials has resulted in the development of several different types of organic and inorganic low-k materials. In particular, incorporation of low-K materials with dielectric constants less than about 3.0 has become standard practice as semiconductor feature sizes have diminished to less than 0.13 microns. As feature sizes decrease below 0.13 microns, for example to 65 nm and below, materials with dielectric constants less than about 2.5 are required. Several different organic and inorganic low-k materials have been developed and proposed for use in semiconductor devices as insulating material having dielectric constants between about 2.2 and about 3.0.

For example, porous silicon oxide based materials are formed by including a carbon based moiety which forms an Si—O—C type structures which forms a porous structure following deposition and curing or treatment processes. In certain processes the entire IMD layer has been deposited in a single step process where the entire IMD layer has about the same density or porosity volume throughout the IMD layer.

One problem with using porous low-K IMD materials has been the difficulty of adapting conventional plasma assisted etching processes to reliably and consistently etch openings with acceptable profiles in a low-K IMD layer. The conductive material is typically patterned and etched using high-energy plasma etch processes. In other process schemes, the low-k material is patterned through the application and patterning of photoresist. The low-k material is etched through the photoresist mask, and then the photoresist is removed with a high energy plasma etch process. The low-k materials are susceptible to damage from a plasma etch because they are softer, less chemically stable or more porous, or any combination of these factors. The plasma damage can manifest itself in higher leakage currents, lower breakdown voltages, and changes in the dielectric constant associated with the low-k dielectric material.

Therefore, a need exists for a manufacturing process whereby damascene structures may be formed without encountering the various problems presented by porous low-K dielectric layers, including an opening etching profile and surface condition to improve integrated circuit device yield, performance, and reliability.

Accordingly, the present disclosure is directed to methods for plasma etching of a feature in a semiconductor wafer having a low-k dielectric. The method utilizes a plasma etching chemistry having a fluorine-containing source gas and a $CO_2$, CO or carboxyl-containing etchant source gas. The method reduces oxygen radical formation, thereby minimizing low-k dielectric damage and increasing device reliability.

Referring to FIGS. 1A-1E, illustrated are cross-sectional side views of a semiconductor wafer at respective sequential stages as the wafer is being processed. Starting with FIG. 1A, a semiconductor substrate 102 is provided. It will be appreciated that "semiconductor substrate" as referred to herein may comprise any type of semiconductor material including a bulk silicon wafer. Further, the term semiconductor substrate can also encompass structures that include non semiconductor materials such as oxide in silicon-on-insulator (SOI), partial SOI substrate, polysilicon, amorphous silicon, or organic materials, among others. In some embodiments, semiconductor substrates can also include multiple wafers or dies which are stacked or otherwise adhered together. Semiconductor substrates can include wafers which are cut from a silicon ingot, and/or any other type of semiconductor/non-semiconductor and/or deposited or grown (e.g. epitaxial) layers formed on an underlying substrate. However, the substrate 102 may alternatively be a germanium substrate or any other suitable material. Furthermore, the substrate 102 may include a compound semiconductor such as silicon carbide, gallium arsenic, indium arsenide, or indium phosphide. The substrate 102 contains a variety of active or passive elements (not shown), such as, transistors, diodes, resistors, capacitors, and other suitable elements for integrated circuits.

Overlying substrate is a conductive region 104. Conductive region 104 can be formed from a metal, and in one embodiment, conductive region is formed from copper. An etch stop layer 106 is formed over the conductive region 104 by, in one embodiment, a conventional chemical vapor deposition (CVD) method. The etch stop layer 106 can comprise silicon nitride, silicon carbon oxygen, silicon carbide, or $Si_3N_4$, and the like, or combinations thereof.

A dielectric layer 108 is formed over the etching stop layer 106. The dielectric layer 108 can include carbon doped silicon dioxide, borophosphosilicate glass (BPSG), borosilicate glass (BSG), phosphosilicate glass (PSG), SiN, $SiO_2$, spun-on-glass (SOG), plasma enhanced (PE) tetraethoxysilane (TEOS), halogenated SiO, fluorinated silicate glass, $Si_wO_x\text{-}C_yH_z$, and/or any other suitable porous low-k material. The dielectric layer 108 has a low dielectric constant value (k). In one embodiment, the dielectric constant is lower than about 3.5. In another embodiment the dielectric constant is lower than about 3.0, and in a still further embodiment, the dielectric constant is lower than 2.3. The dielectric layer 108 is formed on the substrate by a chemical vapor deposition (CVD) process. Alternatively, the dielectric layer may be formed by a low-pressure CVD (LPCVD), plasma-enhanced CVD (PECVD), high-density plasma CVD (HDPCVD), or by spin coating or other suitable process.

The dielectric layer 108 can be an intermetal dielectric (IMD) layer or interlayer dielectric (ILD) for forming interconnect lines between elements within the substrate 102. For simplicity and clarity, one IMD layer is presently described in a damascene process. However, it is understood that the integrated circuit may alternatively contain more than one IMD layer as well as other insulating and metal layers for interconnecting the active and passive elements within the substrate 102.

A capping/hardmask layer 110 overlies dielectric layer 108. Hardmask layer 110 can comprise, for example, SiC, SiN, SiCN, SiOC, or SiON, as well as various other materials, for example, a metal hard mask such as, titanium nitride (TiN). Where the capping/hardmask layer comprises a silicon-containing compound, the capping/hardmask layer 110 can function as an anti-reflective coating (ARC) in a subsequent trench photolithographic patterning process.

A photoresist mask layer 112 is formed over the hardmask layer 110. The photoresist mask layer 112 has a first opening 114 patterned therein by a photolithography process (not shown). The photolithography process patterns the photoresist mask layer 112 by exposing the photoresist to a radiation source through a mask (or reticle). In one embodiment, the photoresist 112 is a positive photoresist. Alternatively, the photoresist 112 may be a negative photoresist or other suitable material. The radiation source is a suitable light source such as an ultra-violet (UV), deep ultra-violet (DUV), or extreme ultra-violet (EUV) source. For example, the radiation source can be, but is not limited to, a mercury lamp having a wavelength of 436 nm (G-line) or 365 nm (I-line); a krypton fluoride (KrF) excimer laser with wavelength of 248 nm; an argon fluoride (ArF) excimer laser with a wavelength of 193 nm; a fluoride ($F_2$) excimer laser with a wavelength of 157 nm; or other light sources having a wavelength below approximately 100 nm. The photoresist 112 is developed by an alkaline developer, so that exposed portions of the photoresist 112 are removed, leaving the opening 114 in the photoresist mask 112. It is understood that various techniques are available for patterning, and that photolithography is only one example.

Referring to FIG. 1B, a second opening 116 is formed in the hardmask layer 110 using the photoresist mask layer 112 with first opening 114 extending through a portion of the photoresist mask layer 112. The first opening 114 exposes a portion of the hardmask layer 110. A first plasma etching process 118 is performed to remove the exposed portion of the hardmask layer 110 to form second opening 116 overlying and proximate to low-k dielectric layer 108. The plasma etching process can employ a plasma etchant gas composition comprising an etchant gas which upon plasma activation provides an active fluorine-containing etchant species. Such etchant gas compositions typically comprise, but are not limited to, fluorocarbon etchant gases. Photoresist mask layer 112 is then removed by an ashing process.

Referring to FIG. 1C, a photoresist masklayer 112' is formed over second opening 116 and photolithography processes 121 are performed to pattern the photoresist mask layer 112' and produce a first feature opening 120 therein. A plasma etching process 122 is then performed to partially etch through dielectric layer 108, as illustrated in FIG. 1D. The etching chemistry of plasma etching process 122 can, in one embodiment, be different from plasma etching process 118. Following the plasma etching process 122, remaining photoresist mask layer 112' pattern portions (not shown) are removed by an oxygen ashing and/or wet stripping process to form first feature opening 120. In one embodiment, first feature opening comprises a via. Plasma etching process 122 will be carried out to expose the low-k dielectric layer 108 to the plasma for a period of from about 60 seconds to about 100 seconds.

A plasma etching process 123 is then performed to define a second feature opening 124 and completely etch through dielectric layer 104, stopping on conductive region 104. Plasma etching process 123 can include a plasma containing a mixture of a fluorine-containing source gas and a $CO_2$, CO or carboxyl-containing etchant source gas. Fluorine in the plasma may be provided by one or more of $C_4F_8$, $CH_xF_y$, $CHF_3+O_2$, $CF_4+O_2$, $CH_2F_2+O_2$, $C_4F_8+O_2$, and $C_4F_6$. The carboxyl-containing source gas can comprise a carboxylic acid, an ascorbic acid, or an amino acid, and the like. In one embodiment, plasma can further comprise one or more carrier gases, for example, argon or nitrogen. The plasma conditions include a flow rate of argon of from about 1000 standard cubic centimeters per minute (sccm), and a flow rate of nitrogen of from about 30 sccm to about 60 sccm. The total flow rate, including all plasma gases, will be from about 1000 sccm to about 1500 sccm, and an operating pressure of from about 50 milliTorr (mTorr) to about 100 mTorr. The chamber temperature can be, in one embodiment, from about 60° C. to about 80° C. The plasma etching process 118 is carried out to expose the low-k dielectric layer 108 to the plasma for a period of from about 30 seconds to about 60 seconds.

By keeping the amount of oxygen radical concentration in the plasma low, damage caused to the low-k dielectric by the oxygen radical is minimized. Thus, the amount of oxygen ions in the plasma will be greater than the amount of oxygen radicals in the plasma. The ratio of oxygen ion to oxygen radical will be dependent upon $CO_2$, CO or carboxyl-containing etchant source gas utilized. In one embodiment, the range of $CO_2$, CO or carboxyl-containing etchant source gas will comprise from about 10% up to about 30% of the total plasma gas. Plasma etching process 123 can be produced in an etching chamber utilizing one of a variety of available methods, such as, for example, inductive coupling plasma, electron cyclotron resonance, helicon wave, surface wave, and some capacitive coupling plasma, and microwave plasma tool.

FIG. 2 illustrates a flow diagram of some embodiments of a method 200 for formation of a semiconductor structure according to an embodiment of the invention. While method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 202 a semiconductor substrate is provided. The semiconductor substrate can have an opening.

A plasma etching is performed at step 204 to provide an opening in a hard mask layer. The plasma can include a source gas containing a fluorine-containing source gas.

At step 206, a partial plasma etching step is performed to provide a first feature opening.

At step 208, a further plasma etching step is performed to provide a second feature opening and complete etching of the first feature opening. The plasma can include a source gas containing a fluorine-containing source gas and a $CO_2$, CO or carboxyl-containing source gas. The method then ends.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated.

Therefore, the disclosure relates to a method of plasma etching a semiconductor feature comprising providing a semiconductor wafer having a low-k dielectric thereon. The method further comprises plasma etching feature openings proximate to the low-k dielectric utilizing a plasma containing a mixture of $C_xF_y$ and a $CO_2$, CO or carboxyl-containing source etching gas.

In another embodiment, the disclosure relates to a method comprising providing a semiconductor wafer in an etching chamber, the wafer comprising an opening extending through a portion of a photoresist mask layer. The method further comprises performing a partial plasma etching to provide a first feature opening overlying a low-k dielectric layer. The method further comprises performing a plasma etching to provide a second feature opening and complete etching of the first feature opening, the etching performed with a plasma formed of a mixture of a $C_xF_y$ and a $CO_2$, CO or carboxyl-containing source gas and a fluorine-containing source gas.

What is claimed is:

1. A method of plasma etching a semiconductor feature, comprising:
   providing a semiconductor substrate having a low-k dielectric layer disposed thereon;
   performing a first plasma etching process to form a via within the low-k dielectric layer; and
   performing a second plasma etching process to form a trench within the low-k dielectric layer at a position overlying the via, wherein the second plasma etching process uses a plasma formed from a fluorine-containing source gas and a carbon dioxide ($CO_2$), a carbon monoxide (CO), or a carboxyl-containing source gas.

2. The method of claim 1, further comprising:
   plasma etching a first opening into a hardmask layer directly overlying the low-k dielectric layer, wherein the first opening defines the trench.

3. The method of claim 2, wherein the hardmask layer comprises silicon carbide (SiC), silicon nitride (SiN), silicon carbonitride (SiCN), silicon oxycarbide (SiOC), silicon oxynitride (SiON), or titanium nitride (TiN).

4. The method of claim 2, further comprising:
   forming a photoresist layer over the first opening, wherein the photoresist layer has a second opening that defines the via.

5. A method, comprising:
   forming a hardmask layer having a first opening exposing a first portion of a low-k dielectric layer overlying a semiconductor substrate that is in an etching chamber;
   forming a photoresist mask layer having a second opening exposing a second portion of the low-k dielectric layer that is smaller than the first portion;
   performing a partial plasma etch process according to the photoresist mask layer to form a via within the low-k dielectric layer; and
   performing a plasma etching process according to the hardmask layer to form a trench within the low-k dielectric layer, wherein the plasma etching process forms a plasma from a mixture of a $CO_2$, a CO, or a carboxyl-containing source gas and a fluorine-containing source gas.

6. The method of claim 5, wherein the low-k dielectric layer comprises a dielectric constant of less than 2.3.

7. The method of claim 5, wherein the plasma etching process is further formed of a carrier gas comprising one or more of argon and nitrogen.

8. The method of claim 7, wherein a flow rate of the argon into the etching chamber is from about 1000 sccm to about 1200 sccm and a flow rate of the nitrogen into the etching chamber is from about 30 sccm to about 60 sccm.

9. The method of claim 5, wherein the fluorine-containing source gas comprises $C_4F_8$, $C_4F_8+O_2$, $CHF_3+O_2$, $CF_4+O_2$, or $CH_2F_2+O_2$.

10. The method of claim 5, wherein the plasma etching process comprises plasma conditions comprising a total flow rate of oases used to form the plasma into the etching chamber of from about 1000 sccm to about 1500 sccm.

11. The method of claim 10, further comprising:
    holding the etching chamber at an operating pressure of from about 50 milliTorr to about 100 milliTorr and at a chamber temperature of from about 60° C. to about 80° C.

12. The method of claim 5, wherein the the partial plasma etch exposes the low-k dielectric layer to a first plasma for a period of from about 30 seconds to about 60 seconds.

13. The method of claim 12, wherein the the plasma etching process exposes the dielectric layer to the plasma for a period of from about 60 seconds to about 100 seconds.

14. The method of claim 13, wherein the first plasma is different than the plasma.

15. The method of claim 5, wherein the carboxyl-containing source gas comprises a carboxylic acid, an ascorbic acid, or an amino acid.

16. The method of claim 1, further comprising:
    forming a first mask layer onto the low-k dielectric layer, which has a first opening corresponding to the trench that exposes the low-k dielectric layer;
    forming a second mask layer onto the first mask layer and the low-k dielectric layer, wherein the second mask layer has a second opening corresponding to the via, which exposes a smaller area of the low-k dielectric layer than the first opening; and selectively etching the low-k dielectric layer according to the first mask layer using the second plasma etching process to form the trench in the low-k dielectric layer.

17. The method of claim 16, wherein the second mask layer has a stepped bottom surface that extends from a first height abutting a top surface of the low-k dielectric layer to a second height abutting a top surface of the first mask layer.

18. The method of claim 5, wherein the photoresist mask layer is disposed onto the hardmask layer and the low-k dielectric layer.

19. The method of claim 5, wherein the photoresist mask layer has a stepped bottom surface that extends from a first height abutting a top surface of the low-k dielectric layer to a second height abutting a top surface of the hardmask layer.

20. A method of forming a metal interconnect layer, comprising:

forming a hardmask layer over a low-k dielectric layer disposed over a semiconductor substrate;

forming a first photoresist layer over the hardmask layer having a first opening that exposes a portion of the hardmask layer;

selectively etching the hardmask layer according to the first photoresist layer using a first plasma etching process to form a second opening in the hardmask layer that exposes the low-k dielectric layer;

forming a second photoresist layer onto and in direct contact with the hardmask layer and the low-k dielectric layer, wherein the second photoresist layer has a third opening that exposes a smaller area of the low-k dielectric layer than the second opening;

selectively etching the low-k dielectric layer according to the second photoresist layer using a second plasma etching process to form a via in the low-k dielectric layer; and selectively etching the low-k dielectric layer according to the hardmask layer using a third plasma etching process to form a trench in the low-k dielectric layer, wherein the third plasma etching process uses a source gas comprising a mixture of a $CO_2$, a CO, or a carboxyl-containing source gas and a fluorine-containing gas.

\* \* \* \* \*

UNITED STATES PATENT AND TRADEMARK OFFICE
CERTIFICATE OF CORRECTION

PATENT NO. : 8,901,007 B2  Page 1 of 1
APPLICATION NO. : 13/733222
DATED : December 2, 2014
INVENTOR(S) : Cheng-Hsiung Tsai et al.

It is certified that error appears in the above-identified patent and that said Letters Patent is hereby corrected as shown below:

In The Claims

Column 6, Claim 10, Line 44 Please replace "...rate of oases used..." with --...rate of gases used...--

Signed and Sealed this
Seventeenth Day of March, 2015

Michelle K. Lee
*Director of the United States Patent and Trademark Office*